United States Patent
Kim

(10) Patent No.: US 9,329,925 B2
(45) Date of Patent: May 3, 2016

(54) SEMICONDUCTOR CHIP AND TRANSMISSION/RECEPTION SYSTEM INCLUDING THE SAME

(71) Applicant: SK hynix Inc., Gyeonggi-do (KR)

(72) Inventor: Hong-Gyeom Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 177 days.

(21) Appl. No.: 14/303,175

(22) Filed: Jun. 12, 2014

(65) Prior Publication Data

US 2015/0180704 A1    Jun. 25, 2015

(30) Foreign Application Priority Data

Dec. 19, 2013    (KR) .................. 10-2013-0159266

(51) Int. Cl.
| | | |
|---|---|---|
| *G06F 7/02* | (2006.01) | |
| *G06F 11/07* | (2006.01) | |
| *G06F 11/00* | (2006.01) | |
| *G06F 11/14* | (2006.01) | |
| *H01L 25/065* | (2006.01) | |

(52) U.S. Cl.
CPC .......... *G06F 11/0793* (2013.01); *G06F 11/004* (2013.01); *G06F 11/14* (2013.01); *H01L 25/0657* (2013.01)

(58) Field of Classification Search
None
See application file for complete search history.

(56) References Cited

U.S. PATENT DOCUMENTS

| 6,791,995 B1 * | 9/2004 | Azenkot ................ H04B 1/707 348/E5.008 |
| --- | --- | --- |
| 2006/0251151 A1 * | 11/2006 | Nakamura .............. H04J 13/00 375/146 |
| 2012/0196409 A1 * | 8/2012 | Or-Bach .......... H03K 19/17736 438/129 |
| 2012/0307561 A1 * | 12/2012 | Joo ..................... G11C 16/0483 365/185.17 |
| 2015/0139368 A1 * | 5/2015 | Abrishamkar ..... H04B 1/71072 375/346 |

FOREIGN PATENT DOCUMENTS

WO    WO 2013/095673    6/2013

* cited by examiner

*Primary Examiner* — M. Mujtaba K Chaudry
(74) *Attorney, Agent, or Firm* — IP & T Group LLP

(57) ABSTRACT

A transmission/reception system includes first to $N^{th}$ channels, where N is an integer equal to or greater than 3; a transmission chip suitable for transmitting first to $(N-1)^{th}$ signals through the first to $(N-1)^{th}$ channels and transmitting a correction signal generated by using the first to $(N-1)^{th}$ signals to the $N^{th}$ channel; and a reception chip suitable for receiving signals of the first to $N^{th}$ channels and generating restored signals of the first to $N^{th}$ channels by using the first to $N^{th}$ channels.

15 Claims, 4 Drawing Sheets

SEMICONDUCTOR CHIP AND TRANSMISSION/RECEPTION SYSTEM INCLUDING THE SAME

CROSS-REFERENCE TO RELATED APPLICATIONS

The present application claims priority to Korean Patent Application No. 10-2013-0159266, filed on Dec. 19, 2013, which is incorporated herein by reference in its entirety.

BACKGROUND

1. Field

Exemplary embodiments of the present invention relate to a technology for transmitting and receiving signals, and more particularly to a technology for preventing a failure in transmitting and receiving signals caused by a failure in a transmission channel.

2. Description of the Related Art

The capacity and speed of semiconductor memories used as memory devices in electronic systems have been increasing and various attempts are being made to package and efficiently drive large-capacity memories in a limited area.

To improve the integration degree, a three-dimensional (3D) structure technology in which a plurality of memory chips are stacked has evolved from a two-dimensional (2D) structure technology. The three-dimensionsal (3D) structure technology is in high demand because of its potential to deliver a high degree of integration (and high capacity), so that the size of the semiconductor chip may be reduced.

A "Through Silicon Via" ("TSV") scheme may be used as the 3D structure technology. The TSV scheme is a possible solution for overcoming deterioration in transmission speed that occurs in a module based on the distance from a controller, a weak point of data bandwidth, and variables of a package. According to the TSV scheme, a path penetrating through a plurality of memory chips is formed, and communication is carried out between the stacked chips by forming electrodes in the path.

When a failure occurs in a TSV, all the chips stacked in the semiconductor package may be useless. If all the chips have to be abandoned due to a failure occurring in the TSV, which is a very small structure, a significant amount of waste occurs. Therefore, there is a need to develop a technology to cope with TSV failures.

SUMMARY

Exemplary embodiments of the present invention are directed to a technology for preventing a failure in transmitting and receiving signals that may be caused by a failure of a transmission channel between chips.

In accordance with an embodiment of the present invention, a transmission/reception system includes first to $N^{th}$ channels, a transmission chip suitable for transmitting first to $(N-1)$ signals through the first to $(N-1)^{th}$ channels and transmitting a correction signal generated by using the first to $(N-1)^{th}$ signals to the $N^{th}$ channel and a reception chip suitable for receiving signals of the first to $N^{th}$ channels and generating restored signals of the first to $N^{th}$ channels by using the first to $N^{th}$ channels.

In accordance with another embodiment of the present invention, a transmission chip includes a correction signal generation unit suitable for correcting first to $(N-1)^{th}$ signals through an XOR operation and generating a correction signal, and first to $N^{th}$ drivers suitable for transmitting the first to $(N-1)^{th}$ signals and the correction signal to first to $N^{th}$ channels.

In accordance with another embodiment of the present invention, a reception chip includes first to $N^{th}$ nodes suitable for receiving signals of first to $N^{th}$ channels, a restoring unit suitable for generating restored signals of the first to $N^{th}$ channels by using signals of the first to $N^{th}$ nodes, and first to $N^{th}$ feedback drivers suitable for driving the restored signals of the first to $N^{th}$ channels generated from the restoring unit to the first to $N^{th}$ nodes.

DETAILED DESCRIPTION

Figure 1:
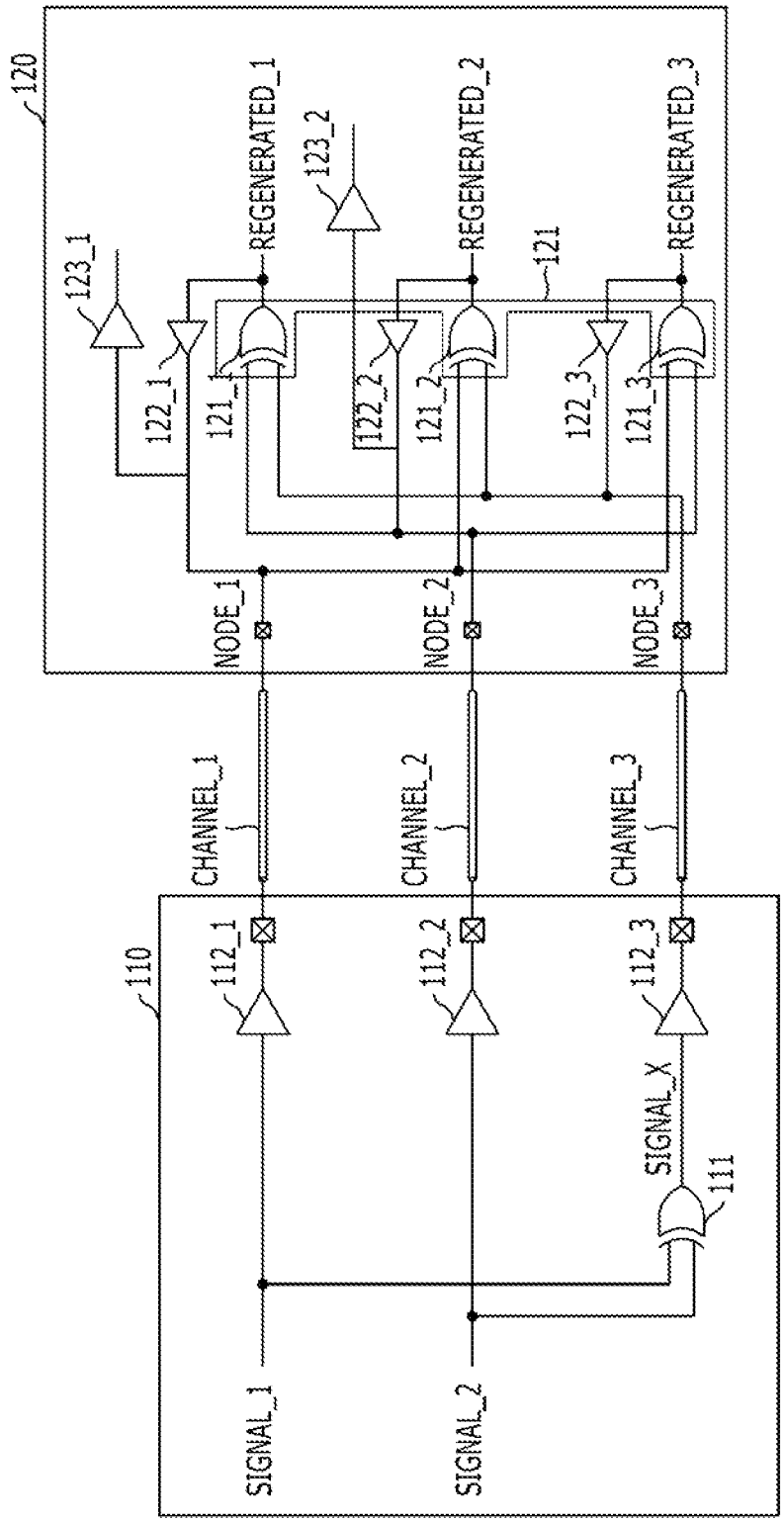
FIG. 1 is a block diagram illustrating a transmission/reception system in accordance with an embodiment of the present invention.

Exemplary embodiments of the present invention will be described below in more detail with reference to the accompanying drawings. These embodiments are provided so that this disclosure will be thorough and complete, and will fully convey the scope of the present invention to those skilled in the art. In describing the present invention, widely-known structures and components irrelevant to the substance of the present invention will be omitted. Throughout the disclosure, like reference numerals refer to like parts throughout the various figures and embodiments of the present invention.

FIG. 1 is a block diagram illustrating a transmission/reception system in accordance with an embodiment of the present invention.

Referring to FIG. 1, a transmission/reception system includes a transmission chip 110, a reception chip 120 and channels CHANNEL_1 to CHANNEL_3.

The transmission chip 110 transmits a first signal SIGNAL_1 and a second signal SIGNAL_2 to a first channel CHANNEL_1 and a second channel CHANNEL_2 and transmits a correction signal SIGNAL_X generated by using the first signal SIGNAL_1 and the second signal SIGNAL_2 to a third channel CHANNEL_3. The transmission chip 110 includes a correction signal generation unit 111 and first to third drivers 112_1 to 112_3. The first signal SIGNAL_1 and the second signal SIGNAL_2 include information that is required for the transmission chip 110 to transmit to the reception chip 120, and the correction signal SIGNAL_X is a signal for preventing a failure of transmission/reception of the signals SIGNAL_1 and SIGNAL_2.

The correction signal generation unit 111 generates the correction signal SIGNAL_X by performing an XOR operation on the first signal SIGNAL_1 and the second signal SIGNAL_2. The correction signal generation unit 111 includes an XOR gate as shown in the drawing. The correction signal SIGNAL_X has a value of "0" when the number of signals having a value of "1" is an even number (e.g., the number of "1"=0 or 2) at the first signal SIGNAL_1 and the second signal SIGNAL_2. The correction signal SIGNAL_X has a value of "1" when the number of signals having a value of "1" is an odd number (e.g., the number of "1"=1) at the first signal SIGNAL_1 and the second signal SIGNAL_2.

The first driver 112_1 transmits the first signal SIGNAL_1 to the first channel CHANNEL_1 and the second driver 112_2 transmits the second signal SIGNAL_2 to the second channel CHANNEL_2. The third driver 112_3 transmits the correction signal SIGNAL_X to the third channel CHANNEL_3.

The reception chip 120 receives the signals of the first to third channels CHANNEL_1 to CHANNEL_3 and generates restored signals REGENERATED_1, REGENERATED_2 and REGENERATED_3 based on the received signals NODE_1 to NODE_3. The reception chip 120 includes first to third nodes NODE_1 to NODE_3, a restoring unit 121, first to third feedback drivers 122_1 to 122_3 and first and second buffers 123_1 and 123_2.

The restoring unit 121 generates the restored signals REGENERATED_1, REGENERATED_2 and REGENERATED_3 based on signals of nodes NODE_1, NODE_2 and NODE_3 received from the channels CHANNEL_1, CHANNEL_2 and CHANNEL_3. The restoring unit 121 generates the third signal REGENERATED_3 restored by performing an XOR operation on signals of the first node NODE_1 and the second node NODE_2. The restoring unit 121 generates the first signal REGENERATED_1 restored by performing an XOR operation on signals of the second node NODE_2 and the third node NODE_3. The restoring unit 121 generates the second signal REGENERATED_2 restored by performing an XOR operation on signals of the third node NODE_3 and the first node NODE_1. The restoring unit 121 includes XOR gates 121_1, 121_2 and 121_3. The restoring unit 121 accurately generates the restored signals REGENERATED_1, REGENERATED_2 and REGENERATED_3 of the first to third channels even when one of the channels CHANNEL_1 to CHANNEL_3 has a failure. For example, when the first signal SIGNAL_1, the second signal SIGNAL_2 and the correction signal SIGNAL_X have a level of (1,0,1), and the first signal SIGNAL_1 is not transmitted to the first node NODE_1 because the first channel CHANNEL_1 is opened, the restoring unit 121 generates the restored signal REGENERATED_1 of the first channel having a level of "1" by using the signals transmitted to the second node NODE_2 and the third node NODE 3.

The first to third feedback drivers 122_1 to 122_3 may feed back the restored signals REGENERATED_1 to REGENERATED_3 of the first to third channels CHANNEL_1 to CHANNEL_3, to the first to third nodes NODE_1 to NODE_3. The first to third feedback drivers 122_1 to 122_3 feed back the restored signals REGENERATED_1 to REGENERATED_3 to the nodes NODE_1 to NODE_3 when the channels CHANNEL_1 to CHANNEL_3 have a failure. For example, when the second signal SIGNAL_2 is not transmitted to the second node NODE_2 because the second channel CHANNEL_2 has a defect when being opened, the signal REGENERATED_2 of the second channel CHANNEL_2 restored by the second feedback driver 122_2 is transmitted to the second node NODE_2. When the first to third channels CHANNEL_1 to CHANNEL_3 are in normal condition, the first to third feedback drivers 122_1 to 122_3 may be designed to have a driving power which is too weak (not powerful enough) to change the logic levels of the first to third nodes NODE_1 to NODE_3 driven by the first to third channels CHANNEL_1 to CHANNEL_3. For example, the restored signal REGENERATED_1 of the first channel is to be transmitted to the first node NODE_1 when the first channel CHANNEL_1 has an open defect, but there is no need for a proper logic level of the second node NODE_2 to be changed by the restored signal REGENERATED_2 of the second channel, which may temporarily have a wrong value due to a wrong value of the signal of the first node NODE_1, when the second channel CHANNEL_2 is in a normal condition.

The first buffer 123_1 buffers a signal of the first node NODE_1, and the second buffer 123_2 buffers a signal of the second node NODE_2. An output signal of the first buffer 123_1 and an output signal of the second buffer 123_2 are the signals used by internal circuits (not shown) of the reception chip 120. The third node NODE_3 is used for correcting a failure of the signal that the reception chip 120 receives. Since the third node NODE_3 is not a node to receive a signal to be used by the internal circuits of the reception chip 120, the third node NODE_3 does not need a buffer.

Table 1 shows the logic level of each of the signals when the first signal SIGNAL_1 and the second signal SIGNAL_2 have a level of (1,0) and the second channel CHANNEL_2 has a failure.

TABLE 1

| SIGNAL_1 | SIGNAL_2 | SIGNAL_X |
|---|---|---|
| 1 | 0 | 1 |
| NODE_1 | NODE_2 | NODE_3 |
| 1 | fail −>0 | 1 |
| REGENERATED_1 | REGENERATED__2 | REGENERATED_3 |
| fail−>1 | 0 | fail−>1 |

Referring to Table 1, although the second channel CHANNEL_2 has a failure, the failure of the second node NODE_2 is restored by the restored signal REGENERATED_2 of the second channel CHANNEL_2. Furthermore, although the signals REGENERATED_1 of the first channel are restored due to the failure of the second channel CHANNEL_2 and an initial value of the restored signal REGENERATED_3 of the third channel has a failure, no failure occurs in the first node NODE_1 and the third node NODE_3 since the driving power of the first feedback driver 122_1 and the third feedback driver 122_3 is weak.

Figure 2:
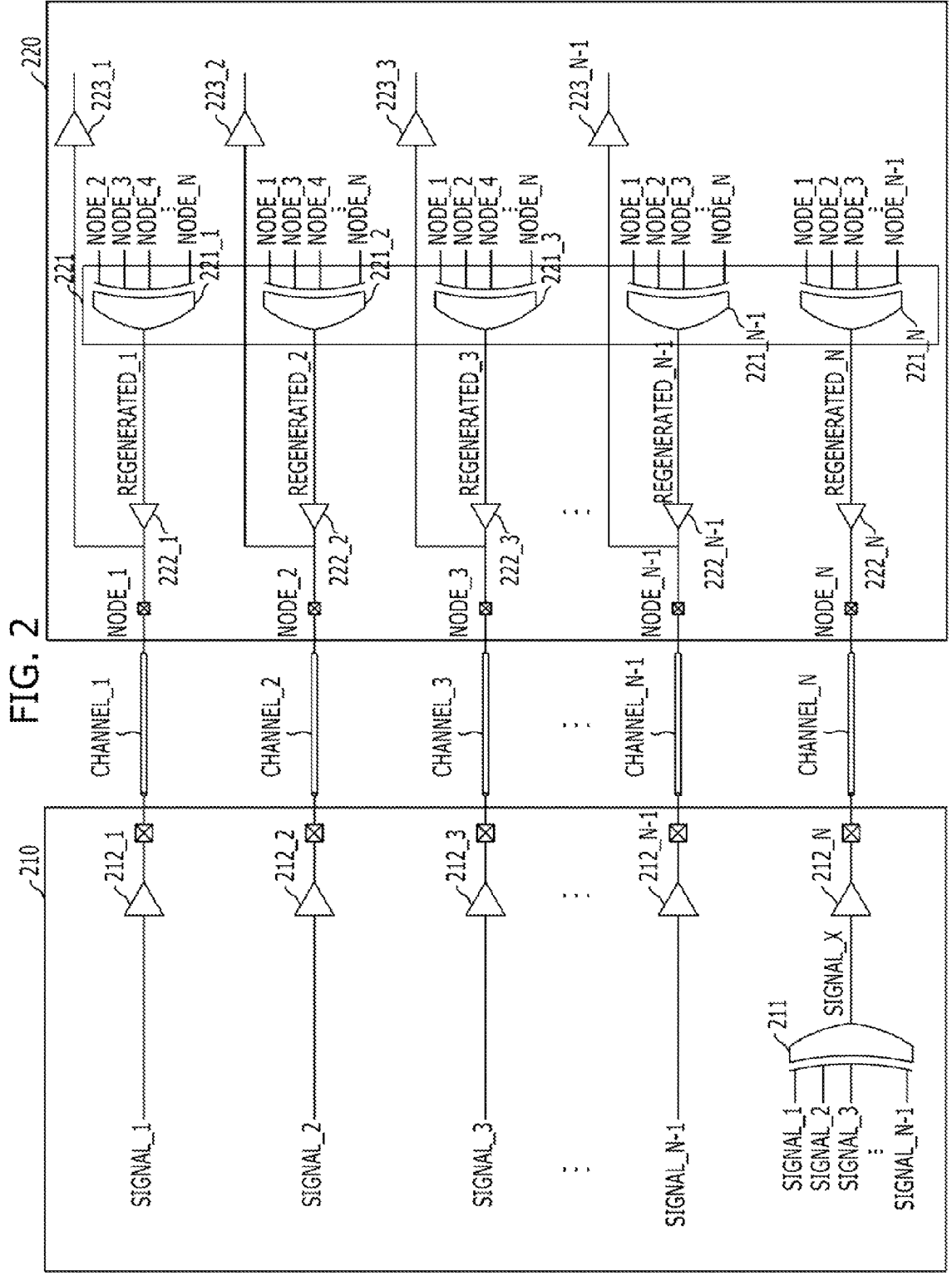
FIG. 2 is a block diagram illustrating a transmission/reception system in accordance with another embodiment of the present invention.

FIG. 2 is a block diagram illustrating a transmission/reception system in accordance with another embodiment of the present invention. While FIG. 1 shows that the three channels CHANNEL_1 to CHANNEL_3 are formed between the transmission chip 110 and the reception chip 120, FIG. 2 shows that N channels CHANNEL_1 to CHANNEL_N are formed between a transmission chip 210 and a reception chip 220. In describing the embodiment of the present invention shown in FIG. 2, a description of overlapping parts shown in FIG. 1 is omitted.

Referring to FIG. 2, a transmission/reception system includes a transmission chip 210, a reception chip 220 and first to N$^{th}$ channels CHANNEL_1 to CHANNEL_N.

The transmission chip 210 transmits first to (N−1)$^{th}$ signals SIGNAL_1 to SIGNAL_N−1 through first to (N−1)$^{th}$ channels CHANNEL_1 to CHANNEL_N−1 and transmits a correction signal SIGNAL_X generated by using the first to (N−1)$^{th}$ signals SIGNAL_1 to SIGNAL_N−1 to a N$^{th}$ channel CHANNEL_N. The transmission chip 210 includes a correction signal generation unit 211 and first to N$^{th}$ drivers 212_1 to 212_N.

Figure 5:
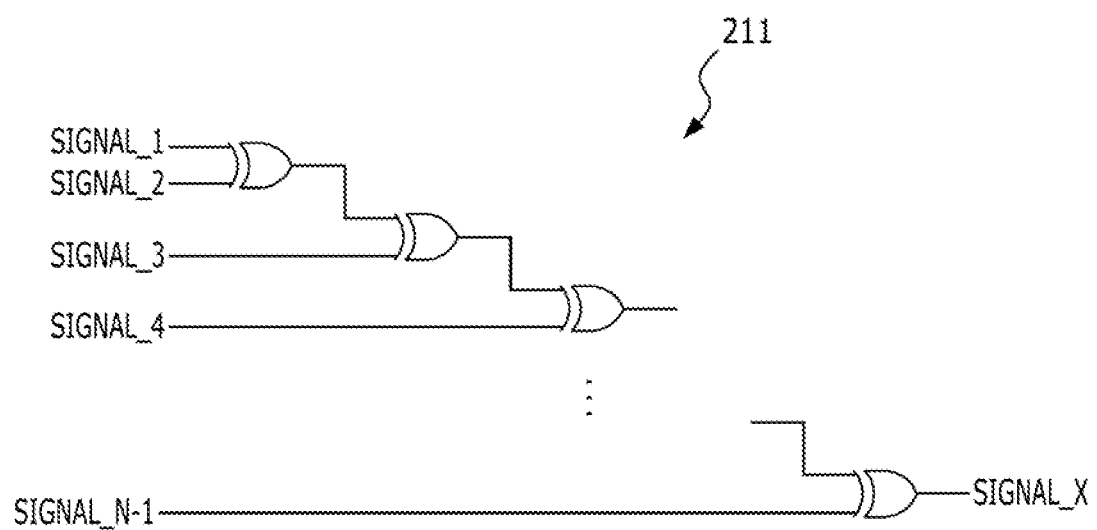
FIG. 5 is a circuit diagram illustrating an N−1 inputs XOR gate.

The correction signal generation unit 211 generates the correction signal SIGNAL_X by performing an XOR operation on the first to (N−1)$^{th}$ signals SIGNAL_1 to SIG- NAL_N−1. The correction signal SIGNAL_X has a value of "0" when the number of signals having a value of "1" among the first to (N−1)$^{th}$ signals SIGNAL_1 to SIGNAL_N−1 is an even number. The correction signal SIGNAL_X has a value of "1" when the number of signals having a value of "1" among the first to (N−1)$^{th}$ signals SIGNAL_1 to SIGNAL_N−1 is an odd number. The correction signal generation unit 211 includes an XOR gate to receive (N−1) signals SIGNAL_1 to SIGNAL N−1. An (N−1)$^{th}$ input XOR gate is shown in FIG. 5. The (N−1)$^{th}$ input XOR gate includes a plurality of 2 input XOR gates.

The reception chip 220 receives signals of the first to N$^{th}$ channels CHANNEL_1 to CHANNEL_N and generates restored signals REGENERATED_1 to REGENERATED_N of the first to N$^{th}$ channels by using received signals NODE_1 to NODE_N. The reception chip 220 includes first to N$^{th}$ nodes NODE_1 to NODE_N, a restoring unit 221, first to N$^{th}$ feedback drivers 222_1 to 222_N and first to (N−1)$^{th}$ buffers 223_1 to 223_N−1.

The restoring unit 221 generates the restored signals REGENERATED_1 to REGENERATED_N of the first to N$^{th}$ channels by using signals of the first to N$^{th}$ nodes NODE_1 to NODE_N. A restored signal of an M$^{th}$ channel REGENERATED_M, where M is an integer from 1 to N, is generated by performing an XOR operation on the other signals, exclusive of a signal of an M$^{th}$ node NODE_M, among the signals of the first to N$^{th}$ nodes NODE_1 to NODE_N. For example, a restored signal REGENERATED_2 of a second channel is generated by performing the XOR operation on a signal of a first node NODE_1 and signals of third to N$^{th}$ nodes NODE_3 to NODE_N. The restoring unit 221 includes N (N−1) input XOR gates 221_1 to 221_N.

Just as in the embodiment of FIG. 1, in the embodiment of FIG. 2, a failure in the transmission/reception of the signals may be prevented by the restoring unit 221 even though there is a failure in one of the channels CHANNEL_1 to CHANNEL_N.

Figure 3:
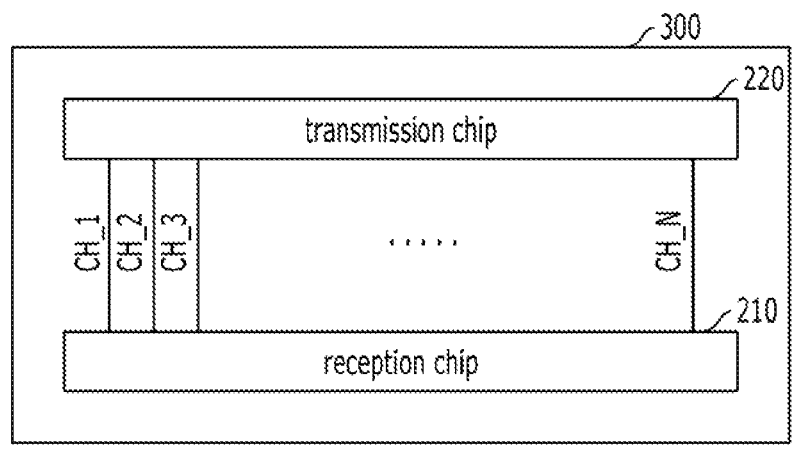
FIG. 3 is a block diagram illustrating the transmission/reception system shown in FIG. 2 being stacked inside a semiconductor package 300.

FIG. 3 is a block diagram illustrating the transmission/reception system shown in FIG. 2, stacked inside a semiconductor package 300.

Referring to FIG. 3, the transmission chip 210 and the reception chip 220 may be stacked inside the semiconductor package 300. The channels CHANNEL_1 to CHANNEL_N may be formed by using Through Silicon Vias (TSVs).

Figure 4:
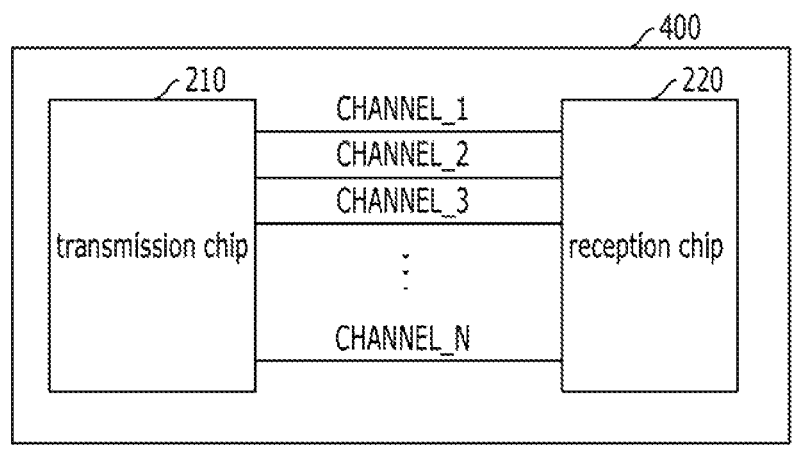
FIG. 4 is a block diagram illustrating the transmission/reception system shown in FIG. 2 being formed over a printed circuit board 400.

FIG. 4 is a block diagram illustrating the transmission/reception system shown in FIG. 2, formed over a printed circuit board 400.

Referring to FIG. 4, the transmission chip 210 and the reception chip 220 may be disposed over the printed circuit board 400, and the channels CHANNEL_1 to CHANNEL_N may be formed by forming lines over the printed circuit board 400.

Exemplary embodiments of the transmission/reception system are described above with reference to the accompanying drawings FIGS. 3 and 4. The transmission/reception system may, however, be realized in different forms and should not be construed as limited to the embodiments set forth herein.

While the present invention has been described with respect to the specific embodiments, it should be noted that the embodiments are for describing, not limiting, the present invention. Further, it should be noted that the present invention may be achieved in various ways through substitution, change, and modification, by those skilled in the art without departing from the scope of the present invention as defined by the following claims.

What is claimed is:

1. A transmission/reception system, comprising:
    first to N$^{th}$ channels, where N is an integer equal to or greater than 3;
    a transmission chip suitable for transmitting first to (N−1)$^{th}$ signals through the first to (N−1)$^{th}$ channels and transmitting a correction signal generated based on the first to (N−1)$^{th}$ signals to the N$^{th}$ channel; and
    a reception chip suitable for receiving signals of the first to N$^{th}$ channels and generating restored signals of the first to N$^{th}$ channels based on the signals of the first to N$^{th}$ channels.

2. The transmission/reception system of claim 1, wherein the transmission chip generates the correction signal by performing an XOR operation on the first to (N−1)$^{th}$ signals.

3. The transmission/reception system of claim 2, wherein the reception chip generates a restored signal of an M$^{th}$ channel by performing an XOR operation on the signals other than a signal of the M$^{th}$ channel, where M is an integer from 1 to N, among the signals of the first to N$^{th}$ channels.

4. The transmission/reception system of claim 1, herein the transmission chip includes:
    a correction signal generation unit for generating the correction signal by performing an XOR operation on the first to (N−1)$^{th}$ signals; and
    first to N$^{th}$ drivers for transmitting the first to N−1)$^{th}$ signals and the correction signal to the first to N$^{th}$ channels.

5. The transmission/reception system of claim 4, wherein the reception chip includes:
    first to N$^{th}$ nodes for receiving signals of the first to N$^{th}$ channels;
    a restoring unit for generating restored signals of the first to N$^{th}$ channels by using signals of the first to N$^{th}$ nodes; and
    first to N$^{th}$ feedback drivers for driving the restored signals of the first to N$^{th}$ channels generated from the restoring unit to the first to N$^{th}$ nodes.

6. The transmission/reception system of claim 5, wherein the reception chip further includes:
    first to (N−1)$^{th}$ buffers for buffering the signals of the first to (N−1)$^{th}$ nodes to be transmitted to one or more internal circuits.

7. The transmission/reception system of claim 5, wherein the restoring unit generates a restored signal of an M$^{th}$ channel by performing an XOR operation on the signals other than a signal of an M$^{th}$ node, where is an integer from 1 to N, among the signals of the first to N$^{th}$ nodes.

8. The transmission/reception system of claim 5, wherein the first to N$^{th}$ feedback drivers have a driving power which does not change logic levels of the first to N$^{th}$ nodes when the first to N$^{th}$ channels are in a normal condition.

9. The transmission/reception system of claim 1, wherein the transmission chip and the reception chip are stacked inside the same semiconductor package, and each of the first to N$^{th}$ channels includes a Through Silicon Via (TSV).

10. The transmission/reception system of claim 1, wherein the transmission chip and the reception chip are formed over a printed circuit board, and each of the first to N$^{th}$ channels includes a line over the printed circuit board.

11. A semiconductor chip, comprising:
    a correction signal generation unit suitable for generating a correction signal by performing an XOR operation on first to (N−1)$^{th}$ signals where N is a integer equal to or greater than 3; and
    first to N$^{th}$ drivers suitable for transmitting the first to (N−1)$^{th}$ signals and the correction signal to first to N$^{th}$ channels.

12. A semiconductor chip, comprising:
first to $N^{th}$ nodes suitable for receiving signals of first to $N^{th}$ channels, where N is an integer equal to or greater than 3;
a restoring unit suitable for generating restored signals of the first to $N^{th}$ channels based on signals of the first to $N^{th}$ nodes; and
first to $N^{th}$ feedback drivers suitable for driving the restored signals of the first to $N^{th}$ channels generated from the restoring unit to the first to $N^{th}$ nodes.

13. The semiconductor chip of claim 12, further comprising:
first to $(N-1)^{th}$ buffers suitable for buffering the signals of the first to $(N-1)^{th}$ nodes to be transmitted to one or more internal circuits.

14. The semiconductor chip of claim 12, wherein the restoring unit generates a restored signal of an $M^{th}$ channel by performing an XOR operation on the signals other than a signal of an $M^{th}$ node, where M is an integer from 1 to N, among the signals of the first to $N^{th}$ nodes.

15. The semiconductor chip of claim 12, wherein the first to $N^{th}$ feedback drivers have a driving power which does not change logic levels of the first to $N^{th}$ nodes when the first to $N^{th}$ channels are in a normal condition.

* * * * *